US010365145B2

(12) United States Patent
Baur et al.

(10) Patent No.: US 10,365,145 B2
(45) Date of Patent: Jul. 30, 2019

(54) HOUSING FOR A HIGH-FREQUENCY CHIP

(71) Applicant: VEGA GRIESHABER KG, Wolfach (DE)

(72) Inventors: Roland Baur, Konigsfeld (DE); Michael Fischer, Alpirsbach (DE); Christoph Mueller, Oppenau (DE); Daniel Schultheiss, Hornberg (DE)

(73) Assignee: VEGA GRIESHABER KG, Wolfach (DE)

( * ) Notice: Subject to any disclaimer, the term of this patent is extended or adjusted under 35 U.S.C. 154(b) by 0 days.

(21) Appl. No.: 15/914,637

(22) Filed: Mar. 7, 2018

(65) Prior Publication Data
US 2018/0259384 A1 Sep. 13, 2018

(30) Foreign Application Priority Data

Mar. 8, 2017 (DE) .......................... 10 2017 203 832

(51) Int. Cl.
*G01F 23/284* (2006.01)
*H01Q 1/22* (2006.01)
(Continued)

(52) U.S. Cl.
CPC ............ *G01F 23/284* (2013.01); *G01S 7/032* (2013.01); *G01S 13/88* (2013.01); *H01L 23/10* (2013.01);
(Continued)

(58) Field of Classification Search
USPC ........................................................ 361/814
See application file for complete search history.

(56) References Cited

U.S. PATENT DOCUMENTS

2006/0186532 A1* 8/2006 Bromberger ........ H01L 23/5223
257/700
2007/0076390 A1 4/2007 Kroener et al.
(Continued)

FOREIGN PATENT DOCUMENTS

DE    10 2005 047 106 B4    4/2007
DE    10 2005 054 233 A1    5/2007
(Continued)

OTHER PUBLICATIONS

Decision to Grant dated Jan. 16, 2018, in German Patent Application No. 10 2017 203 832.2, (13 pages).

*Primary Examiner* — Andargie M Aychillhum
(74) *Attorney, Agent, or Firm* — Oblon, McClelland, Maier & Neustadt, L.L.P.

(57) ABSTRACT

A housing for a high-frequency chip in a radar device for level measurement is provided, including a high-frequency chip having a high-frequency terminal and a supply terminal; horizontal metal layers; vertical metal connecting lines; and an external supply terminal configured to connect the chip to a circuit board of the device, the chip being attached to one of the horizontal metal layers in an electrically conductive manner, and being embedded in a polymer compound, which is located between the horizontal metal layers, the supply terminal being connected to the external supply terminal via at least one of the horizontal metal layers and via at least one of the vertical metal connecting lines, and the high-frequency terminal being connected to an antenna configured to decouple and receive radar waves, via at least one of the horizontal metal layers and/or via at least one of the vertical metal connections.

17 Claims, 3 Drawing Sheets

(51) Int. Cl.
    *G01S 7/03* (2006.01)
    *G01S 13/88* (2006.01)
    *H01L 23/10* (2006.01)
    *H01L 23/00* (2006.01)
    *H01L 23/66* (2006.01)
    *H05K 1/11* (2006.01)
    *H05K 1/18* (2006.01)

(52) U.S. Cl.
    CPC ............ *H01L 23/562* (2013.01); *H01L 23/66* (2013.01); *H01Q 1/225* (2013.01); *H01Q 1/2283* (2013.01); *H05K 1/11* (2013.01); *H05K 1/18* (2013.01); *H01L 2223/6616* (2013.01); *H01L 2223/6666* (2013.01); *H01L 2223/6677* (2013.01)

(56) References Cited

U.S. PATENT DOCUMENTS

2010/0103024 A1*  4/2010  Schultheiss ........... G01F 23/284
                                                  342/124
2015/0377682 A1   12/2015  Gerding et al.

FOREIGN PATENT DOCUMENTS

EP    2 189 765 A1    5/2010
EP    2 963 440 A1    1/2016

\* cited by examiner

HOUSING FOR A HIGH-FREQUENCY CHIP

CROSS-REFERENCE TO RELATED APPLICATION

This application claims the benefit of the filing date of German Patent Application No. 10 2017 203 832.2, filed on 8 Mar. 2017, the entire content of which is incorporated herein by reference.

FIELD

The invention relates to a housing for a high-frequency chip. In particular, the invention relates to a housing for a high-frequency chip that is used in a radar device for level measurement. An additional claim is directed to a radar device for level measurement, the radar device comprising the aforementioned housing for the high-frequency chip.

BACKGROUND

A high-frequency module for level measurement and for use at frequencies of over 75 GHz is known from EP 2 189 765 A1. The high-frequency module comprises a microwave semiconductor, a circuit board, and a housing that is adhesively bonded to the circuit board. In order to reduce the power required, the microwave semiconductor is operated in a pulsed (or clocked) manner. An adhesively secured damping material on a housing cover is used to suppress housing resonances, the housing cover also providing protection against mechanical damage. However, according to EP 2 189 765 A1, a housing of this kind is relatively complex, requires the use of special materials, components and technologies, and therefore cannot be produced in a cost-effective manner.

SUMMARY

The present disclosure relates to providing a housing for a high-frequency chip in a radar device for level measurement, which housing is particularly simple to produce and cost-effective. The described embodiments, together with further advantages, will be best understood by reference to the following detailed description taken in conjunction with the accompanying drawings.

According to an embodiment, a housing for a high-frequency chip in a radar device for level measurement is provided. The housing comprises a high-frequency chip having a high-frequency terminal and a supply terminal, a plurality of horizontal metal layers, a plurality of vertical metal connecting lines, and an external supply terminal for connecting the high-frequency chip to a circuit board of the radar device for level measurement.

The high-frequency chip is attached, in particular adhesively bonded, to one of the horizontal metal layers in an electrically conductive manner and embedded in a polymer compound, which is located between the horizontal metal layers. The supply terminal of the high-frequency chip is connected to the external supply terminal via at least one of the horizontal metal layers and via at least one of the vertical metal connecting lines. Furthermore, the high-frequency terminal of the high-frequency chip is connected to an antenna, for decoupling and receiving radar waves, via at least one of the horizontal metal layers and/or via at least one of the vertical metal connections.

The housing, according to an aspect of the disclosure, is suitable for high frequencies. By providing the horizontal layers and metal vertical connecting lines, as described above, contacting of the high-frequency chip by means of bonding wires known from EP 2 189 765 A1 can be dispensed with. As a result, a correspondingly additional and complex manufacturing step can be omitted, the saving of which brings with it an enormous cost advantage. Furthermore, soldered glass leadthroughs known from EP 2 189 765 A1, can be dispensed with, allowing further cost advantages.

According to an embodiment, the housing further comprises an antenna that is integrated in the housing, in particular a planar antenna, the high-frequency terminal being directly connected to the antenna integrated in the housing via at least one of the horizontal metal layers and/or via at least one of the vertical metal connections. The antenna may, in this case, be arranged in a planar manner and on one of the horizontal metal layers, in particular on a horizontal metal layer that is applied to an upper face of the housing.

According to an alternative embodiment, the housing further comprises a waveguide, the high-frequency terminal being connected to the waveguide via at least one of the vertical metal connections and/or via at least one of the horizontal metal layers, which waveguide is connected to the antenna for decoupling and receiving radar waves. Preferably, a horizontal metal layer is designed to emit a high-frequency signal into a resonant cavity inside the housing, the dimensions of the resonant cavity being sized such that the high-frequency signal is released from the horizontal metal layer and is converted into a waveguide wave which can be decoupled by means of the waveguide.

According to another embodiment, the polymer compound forms an air space directly above the high-frequency chip. The polymer compound may comprise a dielectric constant that is greater than the value 1. As a result, the high-frequency properties of the high-frequency chip could be negatively affected under certain circumstances, since the high-frequency structures are usually located directly on the surface of the high-frequency chip. The air space above the high-frequency chip contributes to reducing the possible negative effect on the high-frequency properties of the high-frequency chip.

Furthermore, the housing may comprise a capacitor. The capacitor may be arranged inside the housing next to the supply terminal of the high-frequency chip and be connected to the supply terminal of the high-frequency chip via at least one of the vertical connecting lines. The supply terminal of the high-frequency chip may be blocked off from a circuit ground via the capacitor. The capacitor may in this case be designed as what is known as a single-layer capacitor, and sits as close as possible to the supply terminal, it being possible for the capacitor to be embedded in the polymer compound in the same way as the high-frequency chip.

According to another embodiment, the high-frequency chip is designed to be operated using a pulsed power supply. It is common for circuits in level measurement technology to be operated using a pulsed power supply, there being times or time periods in a measurement cycle in which unnecessary circuit parts can be disconnected from the power supply in order to save energy. It is possible to operate the high-frequency chip in the housing according to the described embodiments without problems and in an energy-saving manner using a pulsed power supply.

Furthermore, it is possible for one of the horizontal metal layers to form a shielding layer of the housing for electromagnetic shielding and for protection against mechanical damage of circuit structures inside the housing. The shielding layer contributes to protecting the high-frequency chip against external electromagnetic influences. Moreover, the shielding layer makes it possible to minimise unwanted radiation, towards the outside, from the high-frequency chip or other circuit parts which are arranged inside the housing. For this purpose, the shielding layer may particularly preferably be connected to a circuit ground. Furthermore, the shielding layer makes it possible to prevent mechanical damage to circuit structures located thereunder inside the housing. The shielding layer makes it possible, in particular, to dispense with a metal cover known from EP 2 189 765 A1 for electromagnetic shielding and for protection against mechanical damage. The shielding layer is a more cost-effective alternative in particular to a metal cover of this kind.

According to a second aspect of the disclosure, a radar module for a radar device for level measurement is provided. The radar module comprises a housing according to the first aspect of the disclosure. According to a third aspect of the disclosure, a radar device for level measurement is provided. The radar device comprises a radar module according to the second aspect of the disclosure. With regard to effects, advantages, and embodiments of the radar module according to the second aspect of the disclosure and the radar device according to the third aspect of the disclosure, in order to avoid repetition, reference is made to what has been described above in connection with the housing according to the first aspect of the disclosure, and to the following description of the figures.

BRIEF DESCRIPTION OF THE DRAWINGS

In the following description, embodiments are explained in greater detail with reference to the schematic drawings, in which.

DETAILED DESCRIPTION OF EMBODIMENTS

Figure 1:
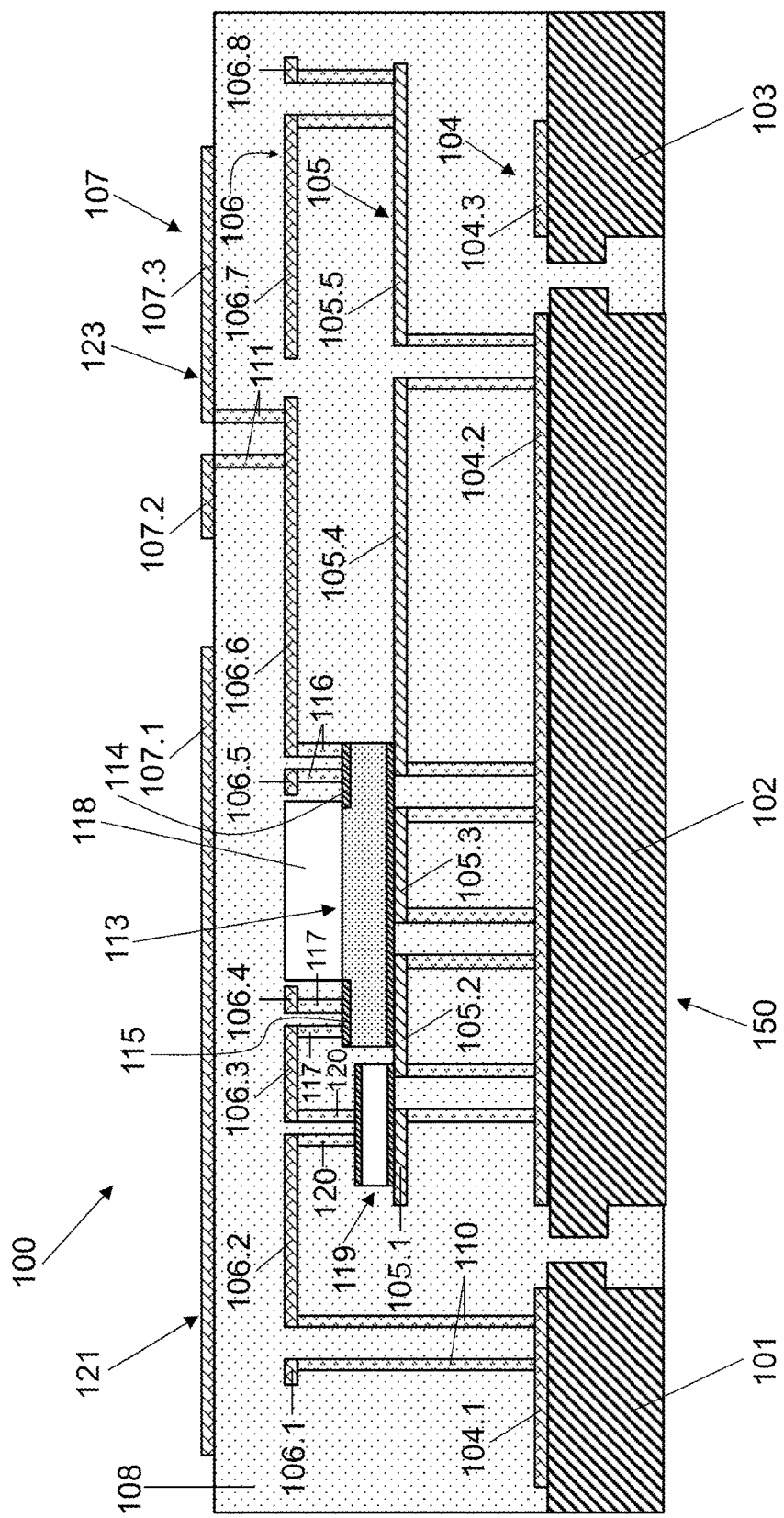
FIG. 1 is a cross-sectional view through a housing according to an embodiment.

FIG. 1 shows a housing 100 for a high-frequency chip 113. The housing 100 may be a component of a radar device 300 for level measurement (cf. FIG. 3). A high-frequency chip 113 is shown in FIG. 1. Alternatively, the housing 100 can, however, also accommodate a plurality of high-frequency chips 113.

The housing 100 may comprise a metal substrate 150, which may comprise a first terminal 101, a second terminal 102 and a third terminal 103, for example. Via said three terminals 101 to 103, the housing 100 can be mounted on a cost-effective circuit board (not shown) by means of a solder connection for example, and electrically connected to said circuit board.

A first horizontal metal layer 104 is applied to the metal substrate 150, which substrate, in the embodiment shown, comprises three portions 104.1 to 104.3 that are mutually spaced at the same height and in the region of openings. "Horizontal" in this context can be understood in particular to mean an orientation that extends in parallel with a circuit board or the metal substrate 150. A second horizontal metal layer 105 is arranged to be spaced apart from the first metal layer 104 and, in the embodiment shown, comprises five portions 105.1 to 105.5 that are mutually spaced at the same height and in the region of openings. The portions 105.1 to 105.5 are interconnected (not shown in the cross-section in FIG. 1) within the metal layer 105. Furthermore, a third horizontal metal layer 106 is arranged to be spaced apart from the second metal layer 105 and comprises a total of eight portions 106.1 to 106.8 that are mutually spaced at the same height and in the region of openings. The portions 106.1 to 106.4 are interconnected (not shown in the cross-section in FIG. 1) within the metal layer 106. Moreover, this applies to the two portions 106.5 and 106.6 and to the both portions 106.7 and 106.8. Moreover, a fourth horizontal metal layer 107 is arranged to be spaced apart from the third metal layer 106 on an upper face of the housing 100, and comprises three portions 107.1 to 107.3 that are mutually spaced at the same height and in the region of openings, the two portions 107.2 and 107.3 in turn being connected (not shown in the cross-section in FIG. 1) within the metal layer 107. The metal layers 104 to 107 may in particular be planar metal layers that comprise a plurality of local openings in particular for feeding plated through-holes (or carrying out through-connections), such that, in spite of the openings, the portions of the metal layers are interconnected outside the openings. As an alternative to the embodiment shown according to FIG. 1, any desired number of metal layers may be inserted in the housing 100, it being possible for the metal layers to be mutually spaced at different vertical distances.

A polymer compound 108 is located between each of the individual metal layers 104 to 107. In the embodiment shown in FIG. 1, the polymer compound 108 fills the entire free interior of the housing 100, with the exception of an air space 118. The polymer compound 108 may be applied in layers and cured during production thereof. In order to introduce the metal layers 104 to 107 into the polymer compound 108, each exposed polymer surface may be coated with metal, such that one of the horizontal metal layers 104 to 107 is produced. Subsequently, the horizontal metal layers 104 to 107 may be covered with additional layers of the polymer.

Figure 2:
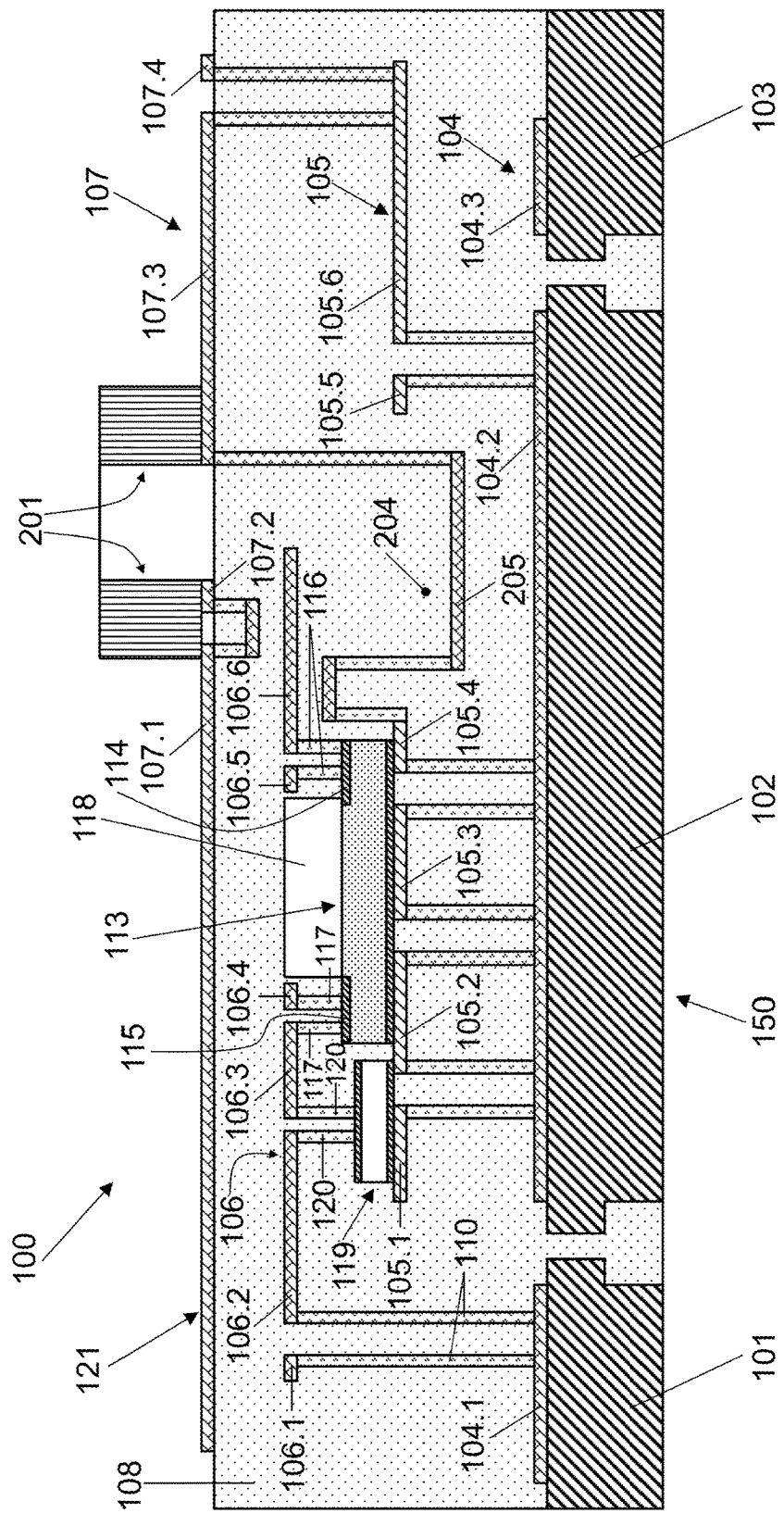
FIG. 2 is a cross-sectional view through a housing according to another embodiment.

In addition to the horizontal metal layers 104 to 107, vertical metal connecting lines are also introduced into the polymer compound 108 inside the housing 100, which connecting lines extend perpendicularly to the horizontal metal layers 104 to 107. Said vertical metal connecting lines can also be referred to as plated through-holes (or through-connections). The vertical metal connecting lines interconnect respectively two portions of the horizontal metal layers 104 to 107 jointly, it being possible for the vertical metal connecting lines to be designed in almost any desired shape. Some of the vertical metal connecting lines are described in greater detail below. In FIGS. 1 and 2, the vertical metal connecting lines are designed as round plated through-holes (or round through-connections) comprising metallised inner walls which are filled with the polymer compound 108.

The high-frequency chip 113 may for example be adhesively bonded to the second horizontal metal layer 105 in an electrically conductive manner and subsequently embedded in the polymer compound 108. In the embodiment shown in FIG. 1, the high-frequency chip 113 is adhesively bonded to the second portion 105.2, the third portion 105.3 and the fourth portion 105.4 of the second horizontal metal layer 105 in an electrically conductive manner.

The high-frequency chip 113 comprises two terminal surfaces 114 and 115, one of the terminal surfaces forming a high-frequency terminal 114, and the other of the terminal surfaces forming a supply terminal 115. The supply terminal 115 of the high-frequency chip 113 is blocked off from a circuit ground by means of a capacitor 119. The capacitor 119 may in this case be designed as a single-layer capacitor, and sits as close as possible to the supply terminal 115, the capacitor 119 being embedded in the polymer compound 108 as well. The capacitor 119 thus sits directly next to the supply terminal 115 of the high-frequency chip 113 and, in the embodiment shown, is connected to the high-frequency chip 113 via a first vertical metal connecting line 117 and via a second vertical metal connecting line 120, and via the third portion 106.3 of the third horizontal metal layer 106 located between the two connecting lines 117 and 120.

The power supply is supplied to the high-frequency chip 113 from the outside, for example via the first terminal 101, which can be soldered to the circuit board. The first terminal 101 may in this case be connected to the first portion 104.1 of the first horizontal metal layer 104 in an electrically conductive manner. In the embodiment shown, the first portion 104.1 of the first horizontal metal layer 104 is connected to the second portion 106.2 of the third horizontal metal layer 106 via a third vertical metal connecting line 110. The second vertical metal connecting line 120 additionally connects the second portion 106.2 of the third horizontal metal layer 106 to the capacitor 119. The high-frequency chip 113, which is embedded in the polymer compound 108 in the housing 100, can be operated without problems using a pulsed power supply.

The fourth metal layer 107, or more precisely the first portion 107.1 thereof, which is arranged above the high-frequency chip 113, forms a shielding layer 121, which contributes to protecting the high-frequency chip 113 against external electromagnetic influences. Moreover, the shielding layer 121 makes it possible to minimise unwanted radiation, towards the outside, from the high-frequency chip 113 or other circuit parts which are arranged inside the housing 100. For this purpose, the shielding layer 121 may particularly preferably be connected to a circuit ground (not shown). The shielding layer furthermore makes it possible to prevent mechanical damage to circuit structures located thereunder inside the housing 100.

In the embodiment shown in FIG. 1, the high-frequency terminal 114 is connected to a planar antenna structure 123, which is located on the upper face of the housing 100, via a fourth vertical metal connecting line 116, the sixth portion 106.6 of the third horizontal metal layer 106, a fifth vertical metal connecting line 111, and the second and third portion 107.2 and 107.3 of the fourth horizontal metal layer 107. The antenna structure 123 comprises the parts 107.2 and 107.3 of the fourth horizontal metal layer 107 and may alternatively also be provided on the other horizontal metal layers 104 to 106 arranged inside the housing 100.

Furthermore, an air space 118 of the polymer compound 108 is left above the high-frequency chip 113. The polymer compound 108 may comprise a dielectric constant, the value of which is greater than "1". As a result, the high-frequency properties of the high-frequency chip 113 could be negatively affected under certain circumstances, since the high-frequency structures are usually located directly on the surface of the high-frequency chip 113. The air space 118 above the high-frequency chip 113 contributes to reducing the possible negative effect on the high-frequency properties of the high-frequency chip 113.

FIG. 2 shows another embodiment of a housing 100 that is similar to the housing 100 according to FIG. 1 and differs substantially in that a waveguide 201 is provided instead of the integrated antenna 123, it being possible to connect the waveguide 201 to an antenna (not shown), via which a high-frequency signal can be emitted and the echo thereof can be received again. Furthermore, the horizontal metal layers 104 to 107 and the vertical metal connecting lines are also partially modified in order to allow decoupling and reception of signals, as described in the following.

A high-frequency signal may be decoupled via the fitted waveguide 201 and the echo of said signal fed back to the high-frequency chip 113 via the fitted waveguide 201. For this purpose, the high-frequency terminal 114 of the high-frequency chip 113 is connected to the sixth portion 106.6 of the third horizontal metal layer 106 via the fourth metal vertical connecting line 116. The sixth portion 106.6 of the third horizontal metal layer 106 guides the high-frequency signal into a resonant cavity 204 of the waveguide 201.

The dimensions of the resonant cavity 204 are sized such that the wave is released from the sixth portion 106.6 of the third horizontal metal layer 106 and is converted into a waveguide wave, which can then be decoupled by means of the fitted waveguide 201. In particular, a distance of a rear boundary 205 of the resonant cavity 204 from the sixth portion 106.6 of the third horizontal metal layer 106 determines the high-frequency properties of the junction. The rear boundary 205 may be an additional horizontal metal layer which, in terms of height, is located between the first horizontal metal layer 104 and the second horizontal metal layer 105. In order to introduce the rear boundary 205 into the polymer compound 108, an exposed polymer surface may be coated with metal, such that the rear boundary 205 is produced. Subsequently, the rear boundary 205 may be covered with additional layers of the polymer. An antenna (not shown in FIG. 2) may, for example, adjoin the waveguide 201, via which antenna the high-frequency signal can be emitted and received again.

Figure 3:
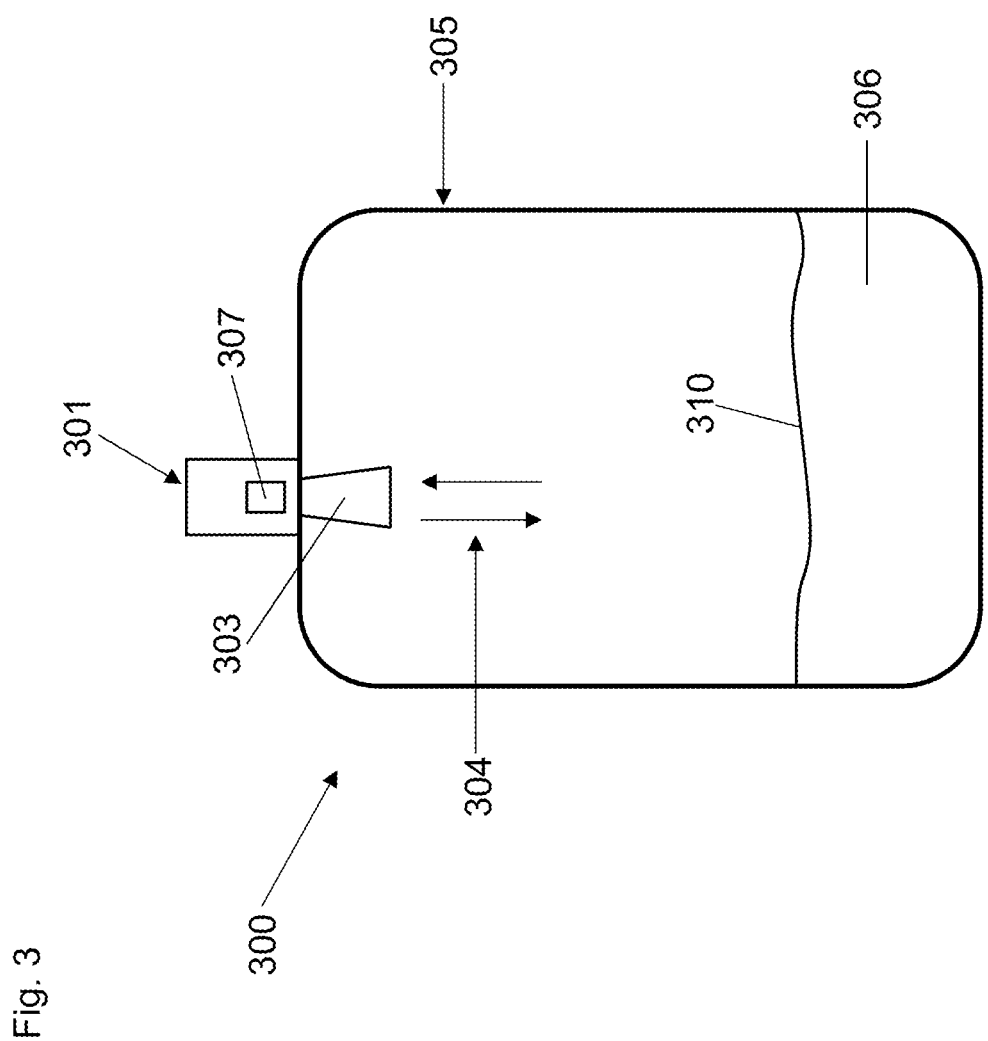
FIG. 3 is a cross-sectional view through a radar device for level measurement according to an embodiment.

FIG. 3 shows a radar device 300 for level measurement. The radar device 300 comprises a level sensor 301 which is attached to a container 305 which is partially filled with a filling material 306. The level sensor 301 sends a radar signal 304 towards a surface 310 of the filling material 306. The radar signal 304 is reflected at the surface 310 of the filling material 306 and fed back to the level sensor 301 via the antenna 303. The level of the filling material 306 can be determined from the time it takes for the radar signal 304 to travel from the level sensor 301 to the surface 310 of the filling material 306 and back to the level sensor 301. The level sensor 301 comprises a radar module 307, which may in turn comprise a housing 100 having one or more integrated high-frequency chips 113, as shown in FIG. 1 or 2.

We claim:

1. A housing for a high-frequency chip in a radar device for level measurement, the housing comprising:
    a high-frequency chip having a high-frequency terminal and a supply terminal;
    a plurality of horizontal metal layers;
    a plurality of vertical metal connecting lines; and
    an external supply terminal configured to connect the high-frequency chip to a circuit board of the radar device for level measurement,
    wherein the high-frequency chip is attached to one of the horizontal metal layers in an electrically conductive manner,
    wherein the high-frequency chip is embedded in a polymer compound, which is located between the horizontal metal layers,
    wherein the supply terminal of the high-frequency chip is connected to the external supply terminal via at least one of the horizontal metal layers and via at least one of the vertical metal connecting lines, and
    wherein the high-frequency terminal of the high-frequency chip is connected to an antenna configured to decouple and receive radar waves, via at least one of the horizontal metal layers and/or via at least one of the vertical metal connections and without the use of bonding wires.

2. The housing according to claim 1,
wherein the antenna is integrated in the housing, and
wherein the high-frequency terminal is directly connected to the antenna integrated in the housing via at least one of the horizontal metal layers and via at least one of the vertical metal connections.

3. The housing according to claim 2, wherein the antenna is planar and is arranged on one of the horizontal metal layers.

4. The housing according to claim 1,
further comprising a waveguide,
wherein the high-frequency terminal is connected to the waveguide via at least one of the vertical metal connections and via at least one of the horizontal metal layers, the waveguide being connected to the antenna configured to decouple and receive radar waves.

5. The housing according to claim 4,
wherein at least one of the horizontal metal layers is configured to emit a high-frequency signal into a resonant cavity inside the housing, and
wherein dimensions of the resonant cavity are sized such that the high-frequency signal is released from the horizontal metal layer and is converted into a waveguide wave, which is decoupled by means of the waveguide.

6. The housing according to claim 1, wherein the polymer compound forms an air space directly above the high-frequency chip.

7. The housing according to claim 1, further comprising a capacitor, arranged inside the housing next to the supply terminal of the high-frequency chip and being connected to the supply terminal of the high-frequency chip via at least one of the vertical connecting lines.

8. The housing according to claim 1, wherein the high-frequency chip is configured to be operated using a pulsed power supply.

9. The housing according to claim 1, wherein one of the horizontal metal layers forms a shielding layer of the housing, configured for electromagnetic shielding and for protection against mechanical damage of circuit structures inside the housing.

10. The housing according to claim 9, wherein the horizontal metal layer is connected to a circuit ground.

11. A radar module for a radar device for level measurement, the radar module comprising a housing according to claim 1.

12. A housing for a high-frequency chip in a radar device for level measurement, the housing comprising:
   a high-frequency chip having a high-frequency terminal and a supply terminal;
   a plurality of horizontal metal layers;
   a plurality of vertical metal connecting lines; and
   an external supply terminal configured to connect the high-frequency chip to a circuit board of the radar device for level measurement,
   wherein the high-frequency chip is attached to one of the horizontal metal layers in an electrically conductive manner,
   wherein the high-frequency chip is embedded in a polymer compound, which is located between the horizontal metal layers,
   wherein the supply terminal of the high-frequency chip is connected to the external supply terminal via at least one of the horizontal metal layers and via at least one of the vertical metal connecting lines,
   further comprising a waveguide,
   wherein the high-frequency terminal is connected to the waveguide via at least one of the vertical metal connections and via at least one of the horizontal metal layers and without the use of bonding wires, the waveguide being connected to the antenna configured to decouple and receive radar waves.

13. The housing according to claim 12,
wherein the antenna is integrated in the housing, and
wherein the high-frequency terminal is directly connected to the antenna integrated in the housing via at least one of the horizontal metal layers and via at least one of the vertical metal connections.

14. The housing according to claim 12, wherein the polymer compound forms an air space directly above the high-frequency chip.

15. The housing according to claim 12, further comprising a capacitor, arranged inside the housing next to the supply terminal of the high-frequency chip and being connected to the supply terminal of the high-frequency chip via at least one of the vertical connecting lines.

16. The housing according to claim 12, wherein the high-frequency chip is configured to be operated using a pulsed power supply.

17. The housing according to claim 12, wherein one of the horizontal metal layers forms a shielding layer of the housing, configured for electromagnetic shielding and for protection against mechanical damage of circuit structures inside the housing.

* * * * *